(12) United States Patent
Mandelboum et al.

(10) Patent No.: US 8,888,331 B2
(45) Date of Patent: Nov. 18, 2014

(54) LOW INDUCTANCE LIGHT SOURCE MODULE

(75) Inventors: David Mandelboum, Rakefet (IL); David Cohen, Nesher (IL); Giora Yahav, Haifa (IL)

(73) Assignee: Microsoft Corporation, Redmond, WA (US)

( * ) Notice: Subject to any disclaimer, the term of this patent is extended or adjusted under 35 U.S.C. 154(b) by 319 days.

(21) Appl. No.: 13/103,120

(22) Filed: May 9, 2011

(65) Prior Publication Data

US 2012/0287646 A1    Nov. 15, 2012

(51) Int. Cl.

| | |
|---|---|
| *H01L 33/38* | (2010.01) |
| *G01S 7/481* | (2006.01) |
| *H01L 33/48* | (2010.01) |
| *G01S 7/484* | (2006.01) |
| *H01L 33/36* | (2010.01) |
| *H01S 5/022* | (2006.01) |

(52) U.S. Cl.
CPC .............. *H01L 33/483* (2013.01); *G01S 7/4814* (2013.01); *H01S 5/02296* (2013.01); *H01S 5/02288* (2013.01); *H01S 5/02212* (2013.01); *H01S 5/02236* (2013.01); *G01S 7/484* (2013.01)
USPC .......................... 362/311.01; 313/505; 257/99

(58) Field of Classification Search
USPC ................. 362/311.01–311.15; 313/498–512; 257/99
See application file for complete search history.

(56) References Cited

U.S. PATENT DOCUMENTS

| | | | |
|---|---|---|---|
| 4,199,703 | A | 4/1980 | Samson |
| 4,627,620 | A | 12/1986 | Yang |
| 4,630,910 | A | 12/1986 | Ross et al. |
| 4,645,458 | A | 2/1987 | Williams |
| 4,695,953 | A | 9/1987 | Blair et al. |
| 4,702,475 | A | 10/1987 | Elstein et al. |
| 4,711,543 | A | 12/1987 | Blair et al. |
| 4,751,642 | A | 6/1988 | Silva et al. |
| 4,796,997 | A | 1/1989 | Svetkoff et al. |
| 4,809,065 | A | 2/1989 | Harris et al. |

(Continued)

FOREIGN PATENT DOCUMENTS

| | | |
|---|---|---|
| CN | 101254344 B | 6/2010 |
| EP | 0583061 A2 | 2/1994 |

(Continued)

OTHER PUBLICATIONS

Kanade et al., "A Stereo Machine for Video-rate Dense Depth Mapping and Its New Applications", IEEE Computer Society Conference on Computer Vision and Pattern Recognition, 1996, pp. 196-202,The Robotics Institute, Carnegie Mellon University, Pittsburgh, PA.

(Continued)

*Primary Examiner* — Anh Mai
*Assistant Examiner* — Nathaniel Lee
(74) *Attorney, Agent, or Firm* — Gregg Wisdom; Judy Yee; Micky Minhas (57) ABSTRACT

An embodiment of the invention provides a low inductance light source module comprising a connector having a layer of insulating material sandwiched between first and second conducting layers and a semiconducting light source that seats in a recess extending through the first conducting layer and the insulating later and has first and second electrical contacts for receiving power electrically connected to the first and second conducting layers.

20 Claims, 5 Drawing Sheets

(56) References Cited

U.S. PATENT DOCUMENTS

| | | | |
|---|---|---|---|
| 4,817,950 A | 4/1989 | Goo |
| 4,843,568 A | 6/1989 | Krueger et al. |
| 4,893,183 A | 1/1990 | Nayar |
| 4,901,362 A | 2/1990 | Terzian |
| 4,925,189 A | 5/1990 | Braeunig |
| 5,101,444 A | 3/1992 | Wilson et al. |
| 5,148,154 A | 9/1992 | MacKay et al. |
| 5,168,537 A | 12/1992 | Rajasekharan et al. |
| 5,184,295 A | 2/1993 | Mann |
| 5,229,754 A | 7/1993 | Aoki et al. |
| 5,229,756 A | 7/1993 | Kosugi et al. |
| 5,239,463 A | 8/1993 | Blair et al. |
| 5,239,464 A | 8/1993 | Blair et al. |
| 5,288,078 A | 2/1994 | Capper et al. |
| 5,295,491 A | 3/1994 | Gevins |
| 5,320,538 A | 6/1994 | Baum |
| 5,347,306 A | 9/1994 | Nitta |
| 5,385,519 A | 1/1995 | Hsu et al. |
| 5,405,152 A | 4/1995 | Katanics et al. |
| 5,417,210 A | 5/1995 | Funda et al. |
| 5,423,554 A | 6/1995 | Davis |
| 5,454,043 A | 9/1995 | Freeman |
| 5,469,740 A | 11/1995 | French et al. |
| 5,495,576 A | 2/1996 | Ritchey |
| 5,516,105 A | 5/1996 | Eisenbrey et al. |
| 5,524,637 A | 6/1996 | Erickson et al. |
| 5,534,917 A | 7/1996 | MacDougall |
| 5,563,988 A | 10/1996 | Maes et al. |
| 5,577,981 A | 11/1996 | Jarvik |
| 5,580,249 A | 12/1996 | Jacobsen et al. |
| 5,594,469 A | 1/1997 | Freeman et al. |
| 5,597,309 A | 1/1997 | Riess |
| 5,616,078 A | 4/1997 | Oh |
| 5,617,312 A | 4/1997 | Iura et al. |
| 5,638,300 A | 6/1997 | Johnson |
| 5,641,288 A | 6/1997 | Zaenglein |
| 5,682,196 A | 10/1997 | Freeman |
| 5,682,229 A | 10/1997 | Wangler |
| 5,690,582 A | 11/1997 | Ulrich et al. |
| 5,703,367 A | 12/1997 | Hashimoto et al. |
| 5,704,837 A | 1/1998 | Iwasaki et al. |
| 5,715,834 A | 2/1998 | Bergamasco et al. |
| 5,875,108 A | 2/1999 | Hoffberg et al. |
| 5,877,803 A | 3/1999 | Wee et al. |
| 5,913,727 A | 6/1999 | Ahdoot |
| 5,933,125 A | 8/1999 | Fernie |
| 5,980,256 A | 11/1999 | Carmein |
| 5,989,157 A | 11/1999 | Walton |
| 5,995,649 A | 11/1999 | Marugame |
| 6,005,548 A | 12/1999 | Latypov et al. |
| 6,009,210 A | 12/1999 | Kang |
| 6,054,991 A | 4/2000 | Crane et al. |
| 6,066,075 A | 5/2000 | Poulton |
| 6,072,494 A | 6/2000 | Nguyen |
| 6,073,489 A | 6/2000 | French et al. |
| 6,077,201 A | 6/2000 | Cheng et al. |
| 6,098,458 A | 8/2000 | French et al. |
| 6,100,896 A | 8/2000 | Strohecker et al. |
| 6,101,289 A | 8/2000 | Kellner |
| 6,128,003 A | 10/2000 | Smith et al. |
| 6,130,677 A | 10/2000 | Kunz |
| 6,141,463 A | 10/2000 | Covell et al. |
| 6,147,678 A | 11/2000 | Kumar et al. |
| 6,152,856 A | 11/2000 | Studor et al. |
| 6,159,100 A | 12/2000 | Smith |
| 6,173,066 B1 | 1/2001 | Peurach et al. |
| 6,181,343 B1 | 1/2001 | Lyons |
| 6,188,777 B1 | 2/2001 | Darrell et al. |
| 6,215,890 B1 | 4/2001 | Matsuo et al. |
| 6,215,898 B1 | 4/2001 | Woodfill et al. |
| 6,226,396 B1 | 5/2001 | Marugame |
| 6,229,913 B1 | 5/2001 | Nayar et al. |
| 6,256,033 B1 | 7/2001 | Nguyen |
| 6,256,400 B1 | 7/2001 | Takata et al. |
| 6,283,860 B1 | 9/2001 | Lyons et al. |
| 6,289,112 B1 | 9/2001 | Jain et al. |
| 6,299,308 B1 | 10/2001 | Voronka et al. |
| 6,308,565 B1 | 10/2001 | French et al. |
| 6,316,934 B1 | 11/2001 | Amorai-Moriya et al. |
| 6,363,160 B1 | 3/2002 | Bradski et al. |
| 6,384,819 B1 | 5/2002 | Hunter |
| 6,411,744 B1 | 6/2002 | Edwards |
| 6,430,997 B1 | 8/2002 | French et al. |
| 6,476,834 B1 | 11/2002 | Doval et al. |
| 6,496,598 B1 | 12/2002 | Harman |
| 6,501,167 B2 | 12/2002 | Hanamura |
| 6,503,195 B1 | 1/2003 | Keller et al. |
| 6,528,882 B2 * | 3/2003 | Ding et al. ............ 257/738 |
| 6,539,931 B2 | 4/2003 | Trajkovic et al. |
| 6,570,555 B1 | 5/2003 | Prevost et al. |
| 6,633,294 B1 | 10/2003 | Rosenthal et al. |
| 6,640,202 B1 | 10/2003 | Dietz et al. |
| 6,661,918 B1 | 12/2003 | Gordon et al. |
| 6,681,031 B2 | 1/2004 | Cohen et al. |
| 6,714,665 B1 | 3/2004 | Hanna et al. |
| 6,731,799 B1 | 5/2004 | Sun et al. |
| 6,738,066 B1 | 5/2004 | Nguyen |
| 6,765,726 B2 | 7/2004 | French et al. |
| 6,788,809 B1 | 9/2004 | Grzeszczuk et al. |
| 6,801,637 B2 | 10/2004 | Voronka et al. |
| 6,821,128 B2 | 11/2004 | Belopolsky |
| 6,873,723 B1 | 3/2005 | Aucsmith et al. |
| 6,876,496 B2 | 4/2005 | French et al. |
| 6,937,742 B2 | 8/2005 | Roberts et al. |
| 6,950,534 B2 | 9/2005 | Cohen et al. |
| 7,003,134 B1 | 2/2006 | Covell et al. |
| 7,036,094 B1 | 4/2006 | Cohen et al. |
| 7,038,855 B2 | 5/2006 | French et al. |
| 7,039,676 B1 | 5/2006 | Day et al. |
| 7,042,440 B2 | 5/2006 | Pryor et al. |
| 7,050,606 B2 | 5/2006 | Paul et al. |
| 7,058,204 B2 | 6/2006 | Hildreth et al. |
| 7,060,957 B2 | 6/2006 | Lange et al. |
| 7,113,918 B1 | 9/2006 | Ahmad et al. |
| 7,121,946 B2 | 10/2006 | Paul et al. |
| 7,170,492 B2 | 1/2007 | Bell |
| 7,184,048 B2 | 2/2007 | Hunter |
| 7,202,898 B1 | 4/2007 | Braun et al. |
| 7,222,078 B2 | 5/2007 | Abelow |
| 7,227,526 B2 | 6/2007 | Hildreth et al. |
| 7,259,747 B2 | 8/2007 | Bell |
| 7,282,734 B2 | 10/2007 | Yamazaki et al. |
| 7,308,112 B2 | 12/2007 | Fujimura et al. |
| 7,317,836 B2 | 1/2008 | Fujimura et al. |
| 7,335,926 B2 * | 2/2008 | Wang et al. ............ 257/99 |
| 7,348,963 B2 | 3/2008 | Bell |
| 7,359,121 B2 | 4/2008 | French et al. |
| 7,367,887 B2 | 5/2008 | Watabe et al. |
| 7,379,563 B2 | 5/2008 | Shamaie |
| 7,379,566 B2 | 5/2008 | Hildreth |
| 7,389,591 B2 | 6/2008 | Jaiswal et al. |
| 7,412,077 B2 | 8/2008 | Li et al. |
| 7,421,093 B2 | 9/2008 | Hildreth et al. |
| 7,430,312 B2 | 9/2008 | Gu |
| 7,436,496 B2 | 10/2008 | Kawahito |
| 7,450,736 B2 | 11/2008 | Yang et al. |
| 7,452,275 B2 | 11/2008 | Kuraishi |
| 7,460,690 B2 | 12/2008 | Cohen et al. |
| 7,489,812 B2 | 2/2009 | Fox et al. |
| 7,536,032 B2 | 5/2009 | Bell |
| 7,555,142 B2 | 6/2009 | Hildreth et al. |
| 7,560,701 B2 | 7/2009 | Oggier et al. |
| 7,570,805 B2 | 8/2009 | Gu |
| 7,574,020 B2 | 8/2009 | Shamaie |
| 7,576,727 B2 | 8/2009 | Bell |
| 7,590,262 B2 | 9/2009 | Fujimura et al. |
| 7,593,552 B2 | 9/2009 | Higaki et al. |
| 7,598,942 B2 | 10/2009 | Underkoffler et al. |
| 7,607,509 B2 | 10/2009 | Schmiz et al. |
| 7,620,202 B2 | 11/2009 | Fujimura et al. |
| 7,668,340 B2 | 2/2010 | Cohen et al. |
| 7,680,298 B2 | 3/2010 | Roberts et al. |
| 7,683,954 B2 | 3/2010 | Ichikawa et al. |
| 7,684,592 B2 | 3/2010 | Paul et al. |

(56) References Cited

U.S. PATENT DOCUMENTS

| | | | |
|---|---|---|---|
| 7,701,439 B2 | 4/2010 | Hillis et al. | |
| 7,702,130 B2 | 4/2010 | Im et al. | |
| 7,704,135 B2 | 4/2010 | Harrison, Jr. | |
| 7,710,391 B2 | 5/2010 | Bell et al. | |
| 7,728,345 B2 | 6/2010 | Cao | |
| 7,729,530 B2 | 6/2010 | Antonov et al. | |
| 7,746,345 B2 | 6/2010 | Hunter | |
| 7,760,182 B2 | 7/2010 | Ahmad et al. | |
| 7,809,167 B2 | 10/2010 | Bell | |
| 7,834,846 B1 | 11/2010 | Bell | |
| 7,852,262 B2 | 12/2010 | Namineni et al. | |
| 7,876,795 B2 | 1/2011 | Belenky et al. | |
| 7,878,689 B2 | 2/2011 | Sun et al. | |
| RE42,256 E | 3/2011 | Edwards | |
| 7,898,522 B2 | 3/2011 | Hildreth et al. | |
| 8,035,612 B2 | 10/2011 | Bell et al. | |
| 8,035,614 B2 | 10/2011 | Bell et al. | |
| 8,035,624 B2 | 10/2011 | Bell et al. | |
| 8,072,470 B2 | 12/2011 | Marks | |
| 2003/0032337 A1 | 2/2003 | Sorensen | |
| 2005/0122031 A1* | 6/2005 | Itai et al. | 313/498 |
| 2006/0214173 A1 | 9/2006 | Beeson et al. | |
| 2008/0026838 A1 | 1/2008 | Dunstan et al. | |
| 2008/0179621 A1* | 7/2008 | Oppermann et al. | 257/99 |
| 2010/0078649 A1* | 4/2010 | Moriyama et al. | 257/76 |
| 2010/0207142 A1 | 8/2010 | Chen et al. | |
| 2010/0207159 A1 | 8/2010 | Jeong | |
| 2010/0208487 A1* | 8/2010 | Li | 362/554 |
| 2012/0091493 A1* | 4/2012 | Lin et al. | 257/98 |

FOREIGN PATENT DOCUMENTS

| | | |
|---|---|---|
| JP | 08044490 A1 | 2/1996 |
| WO | 93/10708 A1 | 6/1993 |
| WO | 97/17598 A1 | 5/1997 |
| WO | 99/44698 A1 | 9/1999 |

OTHER PUBLICATIONS

Miyagawa et al., "CCD-Based Range Finding Sensor", Oct. 1997, pp. 1648-1652, vol. 44 No. 10, IEEE Transactions on Electron Devices.
Rosenhahn et al., "Automatic Human Model Generation", 2005, pp. 41-48, University of Auckland (CITR), New Zealand.
Aggarwal et al., "Human Motion Analysis: A Review", IEEE Nonrigid and Articulated Motion Workshop, 1997, University of Texas at Austin, Austin, TX.
Shao et al., "An Open System Architecture for a Multimedia and Multimodal User Interface", Aug. 24, 1998, Japanese Society for Rehabilitation of Persons with Disabilities (JSRPD), Japan.
Kohler, "Special Topics of Gesture Recognition Applied in Intelligent Home Environments", In Proceedings of the Gesture Workshop, 1998, pp. 285-296, Germany.
Kohler, "Vision Based Remote Control in Intelligent Home Environments", University of Erlangen-Nuremberg/Germany, 1996, pp. 147-154, Germany.
Kohler, "Technical Details and Ergonomical Aspects of Gesture Recognition applied in Intelligent Home Environments", 1997, Germany.
Hasegawa et al., "Human-Scale Haptic Interaction with a Reactive Virtual Human in a Real-Time Physics Simulator", Jul. 2006, vol. 4, No. 3, Article 6C, ACM Computers in Entertainment, New York, NY.
Qian et al., "A Gesture-Driven Multimodal Interactive Dance System", Jun. 2004, pp. 1579-1582, IEEE International Conference on Multimedia and Expo (ICME), Taipei, Taiwan.
Zhao, "Dressed Human Modeling, Detection, and Parts Localization", 2001, The Robotics Institute, Carnegie Mellon University, Pittsburgh, PA.
He, "Generation of Human Body Models", Apr. 2005, University of Auckland, New Zealand.
Isard et al., "Condensation—Conditional Density Propagation for Visual Tracking", 1998, pp. 5-28, International Journal of Computer Vision 29(1), Netherlands.
Livingston, "Vision-based Tracking with Dynamic Structured Light for Video See-through Augmented Reality", 1998, University of North Carolina at Chapel Hill, North Carolina, USA.
Wren et al., "Pfinder: Real-Time Tracking of the Human Body", MIT Media Laboratory Perceptual Computing Section Technical Report No. 353, Jul. 1997, vol. 19, No. 7, pp. 780-785, IEEE Transactions on Pattern Analysis and Machine Intelligence, Caimbridge, MA.
Breen et al., "Interactive Occlusion and Collusion of Real and Virtual Objects in Augmented Reality", Technical Report ECRC-95-02, 1995, European Computer-Industry Research Center GmbH, Munich, Germany.
Freeman et al., "Television Control by Hand Gestures", Dec. 1994, Mitsubishi Electric Research Laboratories, TR94-24, Caimbridge, MA.
Hongo et al., "Focus of Attention for Face and Hand Gesture Recognition Using Multiple Cameras", Mar. 2000, pp. 156-161, 4th IEEE International Conference on Automatic Face and Gesture Recognition, Grenoble, France.
Pavlovic et al., "Visual Interpretation of Hand Gestures for Human-Computer Interaction: A Review", Jul. 1997, pp. 677-695, vol. 19, No. 7, IEEE Transactions on Pattern Analysis and Machine Intelligence.
Azarbayejani et al., "Visually Controlled Graphics", Jun. 1993, Vol. 15, No. 6, IEEE Transactions on Pattern Analysis and Machine Intelligence.
Granieri et al., "Simulating Humans in VR", The British Computer Society, Oct. 1994, Academic Press.
Brogan et al., "Dynamically Simulated Characters in Virtual Environments", Sep./Oct. 1998, pp. 2-13, vol. 18, Issue 5, IEEE Computer Graphics and Applications.
Fisher et al., "Virtual Environment Display System", ACM Workshop on Interactive 3D Graphics, Oct. 1986, Chapel Hill, NC.
"Virtual High Anxiety", Tech Update, Aug. 1995, pp. 22.
Sheridan et al., "Virtual Reality Check", Technology Review, Oct. 1993, pp. 22-28, vol. 96, No. 7.
Stevens, "Flights into Virtual Reality Treating Real-World Disorders", The Washington Post, Mar. 27, 1995, Science Psychology, 2 pages.
"Simulation and Training", 1994, Division Incorporated.
"Power Supply for SIRILAS-30W High Power Laser Diode SPL LG81"—Application Note; Opto Semiconductors: OSRAM Catalog: Jan. 21, 2005, pp. 1-5.
Nanostack Pulsed Laser Diode in Plastic Package, 10W Peak Power; Lead (Pb) Free Product-RoHS Compliant; from Osram website/ catalog:SPL PL85; Mar. 4, 2009, Data Sheet: http://catalog.osram-os.com/catalogue/catalogue.do?favOid=0000000200020fc100070023&act=showBookmark.
PCT International Search Report: PCT/US2012/036385 mailed on Oct. 23, 2012.

* cited by examiner

LOW INDUCTANCE LIGHT SOURCE MODULE

TECHNICAL FIELD

Embodiments of the invention relate to illumination systems that provide short pulses of light.

BACKGROUND

Illumination systems configured to produce a train of light pulses that are repeated at high frequency are used as stroboscopic, fast photography lamps for studying ultrafast processes in physics, chemistry, and biology. Such illumination systems are also used to provide pulses of light in time of flight (TOF) cameras, often referred to as TOF three dimensional (3D) cameras, that provide distance measurements to features in a scene that they image.

"TOF-3D" cameras determine distances to features in a scene by acquiring an image, conventionally referred to as a "range image", of the scene that can be processed to determine how long it takes light to travel from the camera to the features and back to the camera. The round trip flight times of the light to and back from the features determined from the range image and the speed of light are used to determine the distances to the features.

In some TOF-3D cameras, to acquire a range image suitable for processing to determine the times of flight, a light source transmits a train of short duration pulses of light to illuminate the scene. Following a predetermined delay after transmittal of each light pulse in the light pulse train, the camera is shuttered open for a short exposure period. Light from the light pulse that is reflected by features in the scene, and that reaches the camera during the exposure period, is imaged by the camera on pixels of the camera's photosensor. An amount of light from all the light pulses in the train that is registered by a given pixel is used to determine a round trip time of flight for light, to and back from, a feature imaged on the given pixel, and therefrom a distance to the feature.

Light pulses in a light pulse train that are transmitted by a light source to illuminate a scene imaged by a TOF-3D camera and exposure periods of the TOF-3D camera may have durations as short as a few nanoseconds and repetition frequencies greater than a megahertz (MHz). Furthermore, amounts of light that features in the scene reflect from the transmitted light pulses are generally limited. As a result, reflected light available from a feature imaged on a pixel may not be sufficient to determine a distance to the feature having an acceptable signal to noise ratio (SNR).

Compensating for factors that limit light available for acquiring an acceptable range image by increasing light intensity provided by the light source is generally both technically and cost-wise challenging. Cost considerations and heat dissipation requirements for maintaining the light source, and camera, at an acceptable operating temperature usually limit intensity of illumination provided by the light source. The fast switching demands mandated by the high repetition rates, which as noted above may exceed a megahertz (MHz), of light pulses provided by the light source, and a common demand that electronic and optical components of systems have small footprints compound the challenges. A footprint of an electronic component conventionally refers to a size of an area of a circuit board that the component occupies. If a volume that a circuit occupies is a relevant characteristic for consideration, a volume occupied by a component may be understood to be the component's footprint.

SUMMARY

An embodiment of the invention provides a light source module comprising a semiconducting light source and a low inductance electrical connector that mechanically supports the light source and provides conductors for electrically connecting it to a power supply. The electrical connector comprises a layer of insulating material sandwiched between first and second electrically conducting layers. A recess formed in the connector extends through the first conducting layer and the insulating layer to expose a region of the second conducting layer. The light source seats in the recess so that it electrically contacts the exposed region of the second conducting layer and is electrically connected to the first conducting layer by short conducting leads. The conducting layers are relatively wide and closely spaced, and function as conductors for connecting the light source to the power supply. Current provided by the power supply flows in the conductors to and from the light source in substantially opposite directions. The closely spaced wide conductors configured to carry current in opposite directions provide the light source with a low inductance connection to the power supply.

The low inductance connection contributes to efficient use by the light source of energy available from a power supply that powers the light source and operates to moderate transient voltage swings that may accompany switching on and switching off the light source at high frequencies when it is operated to produce short light pulses at a high repetition rate. The wide conductors also provide thermally conductive channels for efficient dissipation of heat generated by operation of the light source.

In an embodiment of the invention, the connector is configured to readily be connected to a printed circuit board (PCB) so that the conductors contact conducting tracks in the PCB connected to circuitry for powering and/or controlling the light source. The connector may be formatted having an advantageously small footprint. In an embodiment of the invention the connector is coupled to a lens tube comprising optics that configure and direct light provided by the light source to provide a beam of light for illuminating a desired field of view. The layered construction of the connector facilitates relatively efficient and inexpensive, simultaneous production of a plurality of light source modules.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION

Figure 1A:
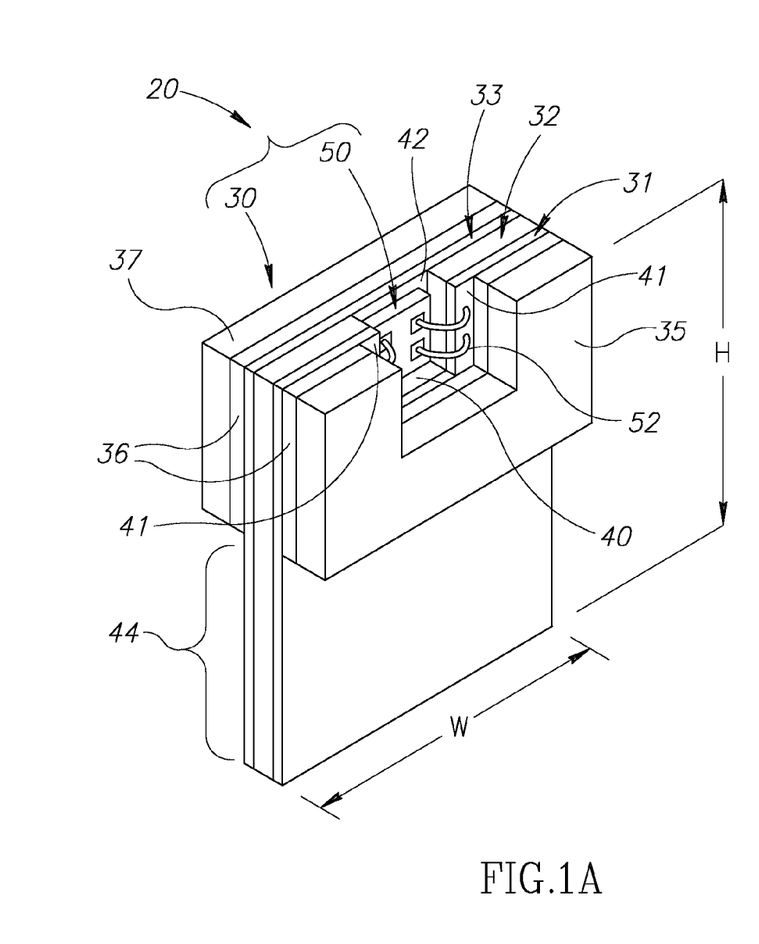
FIGS. 1A-1D schematically show light source modules comprising a light source mounted to a low inductance electrical connector, in accordance with embodiments of the invention.
Figure 1B:
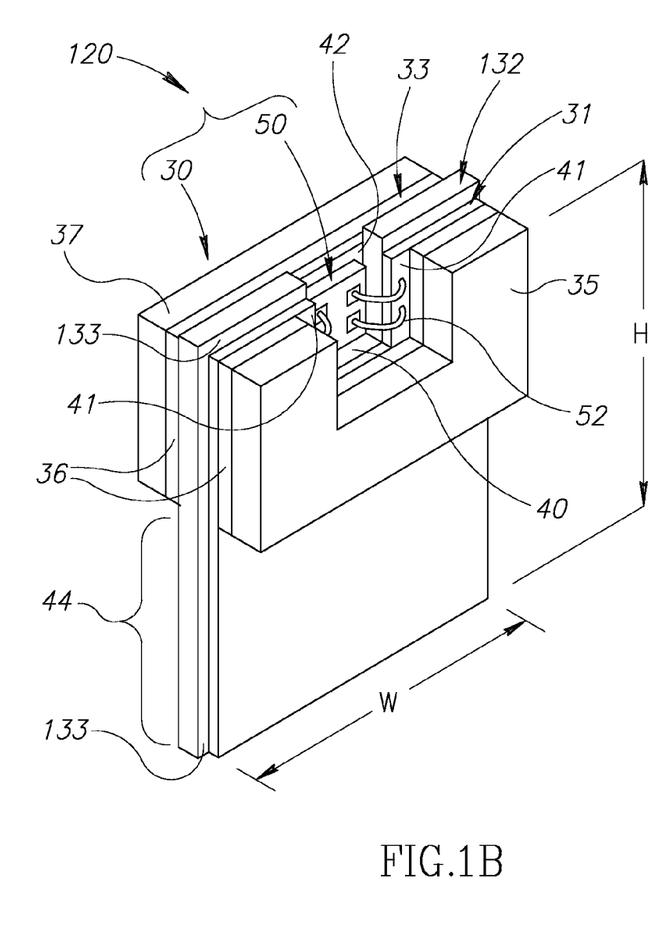

In the following paragraphs of the detailed description, light source modules and their components in accordance with embodiments of the invention are discussed with reference to FIGS. 1A and 1B, and numerical examples that provide exemplary dimensions for features and components of the light source modules shown in the figures are given. The light source module shown in FIG. 1A is schematically shown mounted to a lens tube in FIG. 2, and features of the lens tube and its mating with the light source module are discussed. Operation and powering of the light source are then described with reference to FIG. 3. A method of substantially simultaneously producing a plurality of light source modules similar to the light source modules shown in FIGS. 1A and 1B is described with reference to FIGS. 4A and 4B.

In the discussion, unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended.

FIG. 1A schematically shows, a light source module 20 comprising a low inductance connector 30 to which a semiconductor light source 50, is mounted. Light source 50 may comprise, by way of example, a laser diode, vertical cavity surface emitting laser (VCSEL), and/or an edge emitting laser, operable to provide short light pulses at a high repetition rate for use in a TOF-3D camera. By way of example, in FIG. 1A and figures that follow light source 50 is assumed to be an edge emitter diode laser light source.

Connector 30 comprises a layer 32 of insulating material, such as a ceramic, glass, a suitable polymer, or a layer of a compound material such as a printed circuit board, sandwiched between first and second conductors 31 and 33 respectively. Conductors 31 and 33 may be formed from any suitable conducting material and are optionally made from a sheet of metal or metal alloy such as copper, or silver, or copper plated with nickel, palladium or gold. The conductors are bonded to insulating layer 32 using any of various bonding materials such as an epoxy or adhesive. Optionally, connector 30 comprises two insulating "shoulders" 35 and 37, which are shown bonded to conductors 31 and 33 respectively, optionally by layers 36 of a bonding material comprising an adhesive or epoxy. Material in shoulder 35, conductor 31 and insulating layer 32 is removed to form a relatively small "terraced" recess 40 that exposes regions 41, hereinafter "contact" regions 41 of first conductor 31. The recess extends to second conductor 33 to expose a region, hereinafter a mounting region 42, of the second conductor.

Light source 50 seats in recess 40 and is bonded to mounting region 42 of second conductor 33 using a conducting adhesive or epoxy so that a cathode (not shown) of the light source is electrically connected to the second conductor. Bondwires 52 electrically connect an anode (not shown) of the light source to contact regions 41 and thereby to first conductor 31. Dimensions of recess 40 are made relatively small so that bondwires 52 are relatively short. Optionally, the bondwires are ribbon-shaped, relatively flat strips of conducting material.

A portion 44 of the sandwich comprising insulating layer 32 and conductors 31 and 33 below shoulders 35 and 37 functions as a male plug for insertion into a matching socket to connect the conductors to a driving circuit that powers and/or controls the light source. Optionally the matching socket is a socket comprised in a PCB, and when portion 44 is inserted into the socket conductors 31 and 32 electrically contact power traces on the PCB that are connected to a driving circuit that powers and/or controls the light source. Shoulders 35 and 37 may operate to limit a depth into which conductors 31 and 33 are inserted into the socket, and may seat on edges of the socket to aid in mechanically stabilizing the connector in the socket. Current provided by the driving circuit to power and/or control the light source 50 flows "upwards" along one of conductors 31 and 33 into the light source 50 and leaves the light source, and flows "downwards" along the other of conductors 31 and 33 to return to the driving circuit.

FIG. 1B schematically shows a variation 120 of light source module 20 that is identical to light source module 20 except for an insulating layer 132, which replaces insulating layer 32 in light source module 20. Insulating layer 132 has a border region 133, which protrudes beyond conductors 31 and 32 to provide improved protection against electrical breakdown between the conductors when powering light source 50.

Figure 1C:
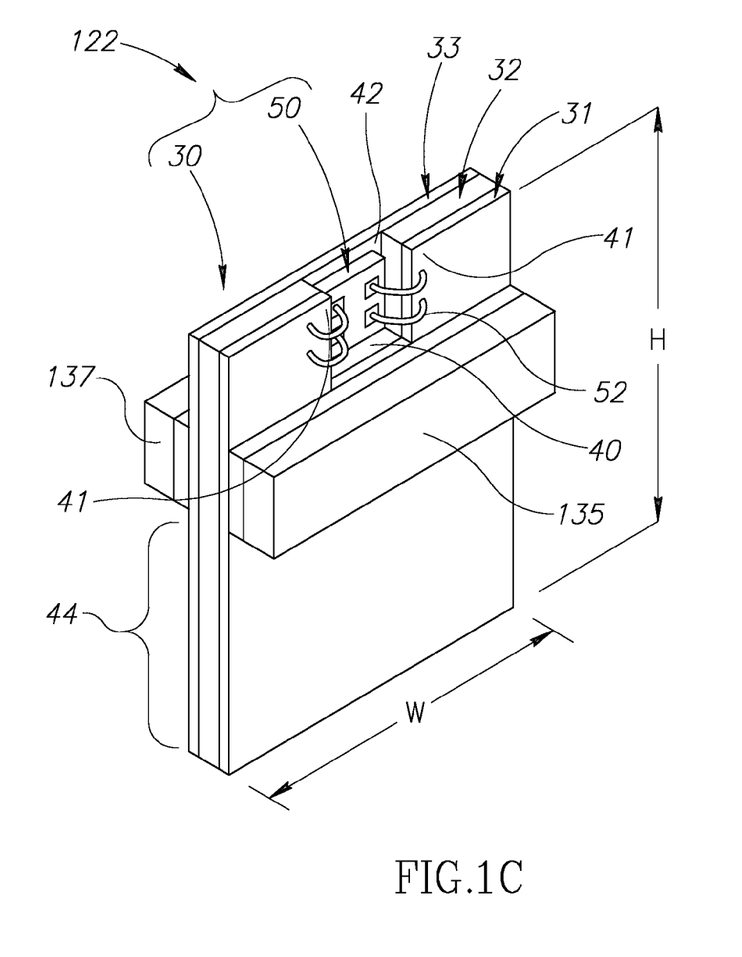

FIG. 1C schematically shows another variation 122 of light source module 20 that is identical to light source module 20 except for insulating shoulders 135 and 137, which replace insulating shoulders 35 and 37 in light source module 20.

Figure 1D:
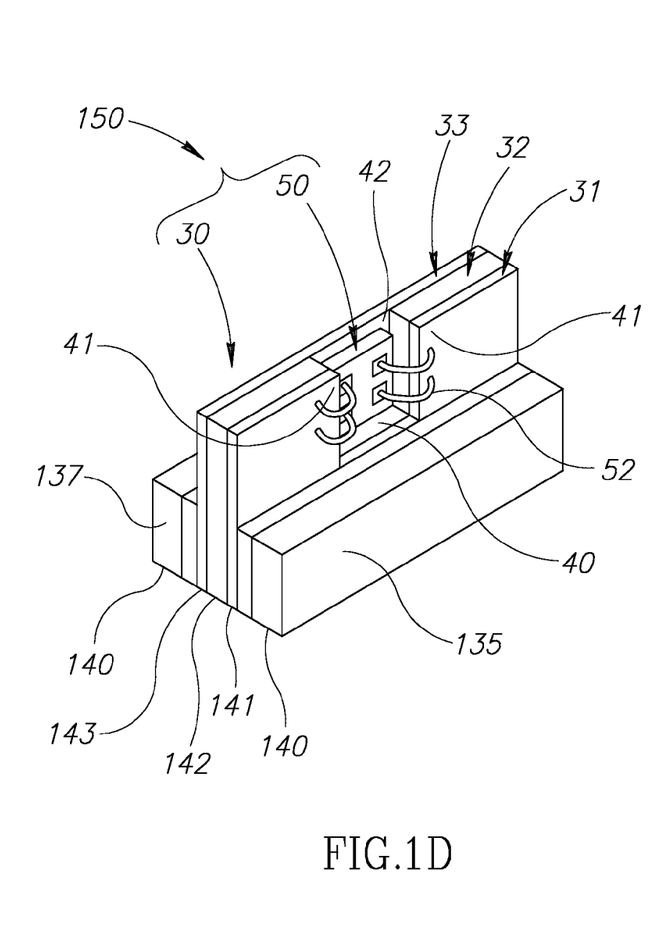

FIG. 1D schematically shows a variation 150 of light source module 122 that is adapted for easy mounting to a PCB using surface mounted technology (SMT). Light source module 150 is, optionally, identical to light source module 122 except for removal of portion 44 in light source module 122 that extends below shoulder 135 and 137 so that layer 31, 32, 33 have edge surfaces 141, 142 and 143 respectively that are coplanar with bottom edge surfaces 140 of shoulders 135 and 137. Light source module 150 may readily be surface mounted to a PCB by placing the module on a surface of the PCB so that edge surfaces 141 and 143 contact conducting pads on the PCB and soldering the edge surfaces to the pads.

Inductance of a conductor generally decreases linearly with decrease in the conductor length, and as the log of the inverse of the conductor width. Inductance of a circuit configured having parallel conductors carrying current in opposite directions decreases as a distance between the conductors decreases. By making conductors 31 and 33 relatively short, wide, and closely spaced, and arranging the conductors to carry current in opposite directions, in accordance with an embodiment of the invention, connector 30 is characterized by a relatively low inductance for connecting light source 50 to a power supply. Configuring recess 40 so that the light source is directly electrically connected to conductor 33, and to conductor 31 by relatively short and wide bondwires 52 further contributes to reducing inductance of connector 30. In addition to providing current to light source 50, the short and wide conductors 31 and 33 also function as heat sinks and thermal conductors for removing heat generated by the light source when it is in operation.

Connecting light source 50 to a power supply using a low inductance connector in accordance with an embodiment of the invention, such as connector 30 is advantageous for controlling the light source to generate light pulses at a high repetition rate, and generally improves efficiency of use of energy available to the light source from the power supply.

Inductance in a connector that electrically connects a power supply to a light source contributes to limiting how fast the light source can be turned on and turned off, and as a result, how short light pulses provided by the light source can be made, and how fast they can be repeated. Inductance in a fast switching circuit operating to generate short duration light pulses at a high repetition rate can also contribute to producing transient voltages in the circuit that are potentially damaging to the circuit. And inductance is prone to generate undesirable phase differences between voltage and current provided to the light source that reduce efficiency with which the power supply couples energy into the light source. Providing a low inductance connector for coupling the light source to the power supply tends to moderate potentially performance-limiting effects of inductance.

By way of a numerical example, in an embodiment of the invention, connector 30 has a height, "H" less than or equal to about 5 mm and a width "W" less than or equal to about 4 mm. Optionally, H is less than or equal to about 2.5 mm. W may be less than or equal to about 3 mm. In an embodiment of the invention, H is equal to about 3.6 mm and W is equal to about 2.8 mm. In another embodiment, H is equal to about 1.8 mm and W is equal to about 2 mm.

Insulating layer 32, conductors 31 and 33 and insulting shoulders 35 and 36 have respective thicknesses less than or equal to about 0.5 mm in an embodiment of the invention. Optionally, the thicknesses are less than or equal to about 0.4 mm. In an embodiment of the invention, the thicknesses are less than or equal to about 0.3 mm. Conductors 31 and 33 may have thickness between about 0.1 and about 0.2 mm. Insulting layer 32 and insulting shoulders 35 and 37 may have thickness between about 0.2 mm and about 0.3 mm. Optionally, bonding layers 36 have thickness less than or equal to about 0.2 mm. Optionally, thickness of the bonding layers is equal to about 0.15 mm.

Whereas recess 40 is configured to have dimensions that accommodate a specific model light source 50 with which it is used and electrically connect the light source to mounting region 42 of conductor 33 and contact regions 41 of conductor 31, an exemplary recess 40 has a height parallel to H and width parallel to W in shoulder insulator 35 that are less than or equal respectively to about 1 mm and 1.5 mm. Optionally, mounting region 42 has height and width (respectively parallel to H and W) less than or equal to about 1 mm and 1.1 mm respectively. In an embodiment of the invention, recess 40 has height and width in insulating shoulder 35 equal to about 0.8 mm and 1.2 mm respectively, and mounting region 42 is square and has a side length equal to about 0.8 mm. Insulating shoulders 35 and 37 optionally have height less than or equal to about 1.6 mm.

In an embodiment of the invention, bondwires 52 that connect light source 50 to conductor 31 have lengths less than or equal to about 0.75 mm. Optionally, the bondwires are less than 0.5 mm. In some embodiments of the invention, bondwires 52 have lengths less than or equal to about 0.4 mm.

In an embodiment of the invention, connector 30 is characterized by an inductance less than or equal to about 3 nH (nanoHenrys). In some embodiments of the invention, connector 30 is characterized by an inductance less than or equal to about 2.5 nH. For conductors 31 and 33 having heights H and widths W equal to about 2.6 mm and 4.5 mm respectively, connector 30 presents an inductance less than or equal to about 2.3 nH to a circuit that controls light source 50 to emit light pulses. The inductance that characterizes the connector for the above noted dimensions is less than conventional configurations of conductors, which are typically characterized by inductances equal to or greater than about 4 nH.

Figure 2:
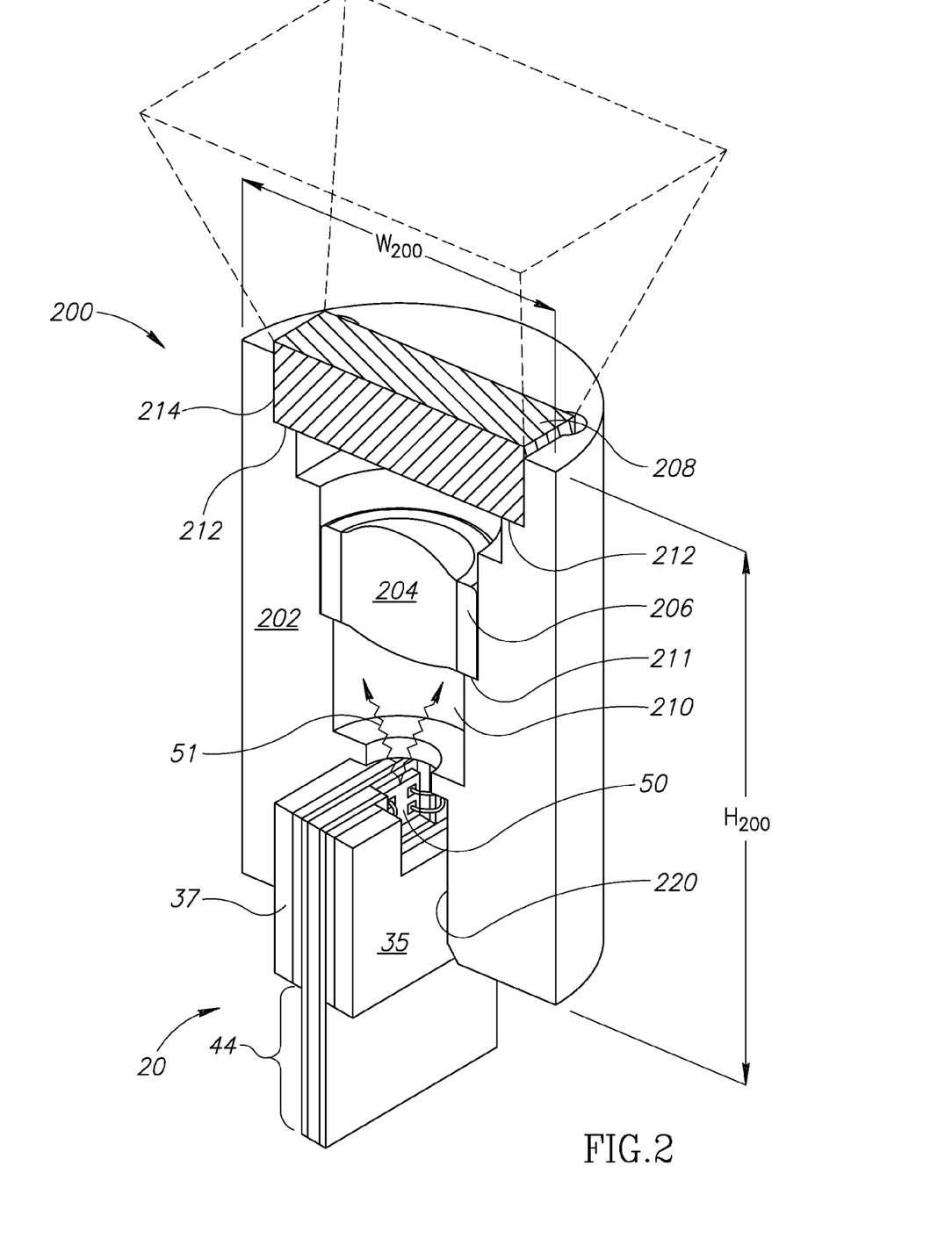
FIG. 2 schematically shows a schematic cutaway view of the light source module shown in FIG. 1A coupled to a lens tube, in accordance with an embodiment of the invention.
Figure 3:
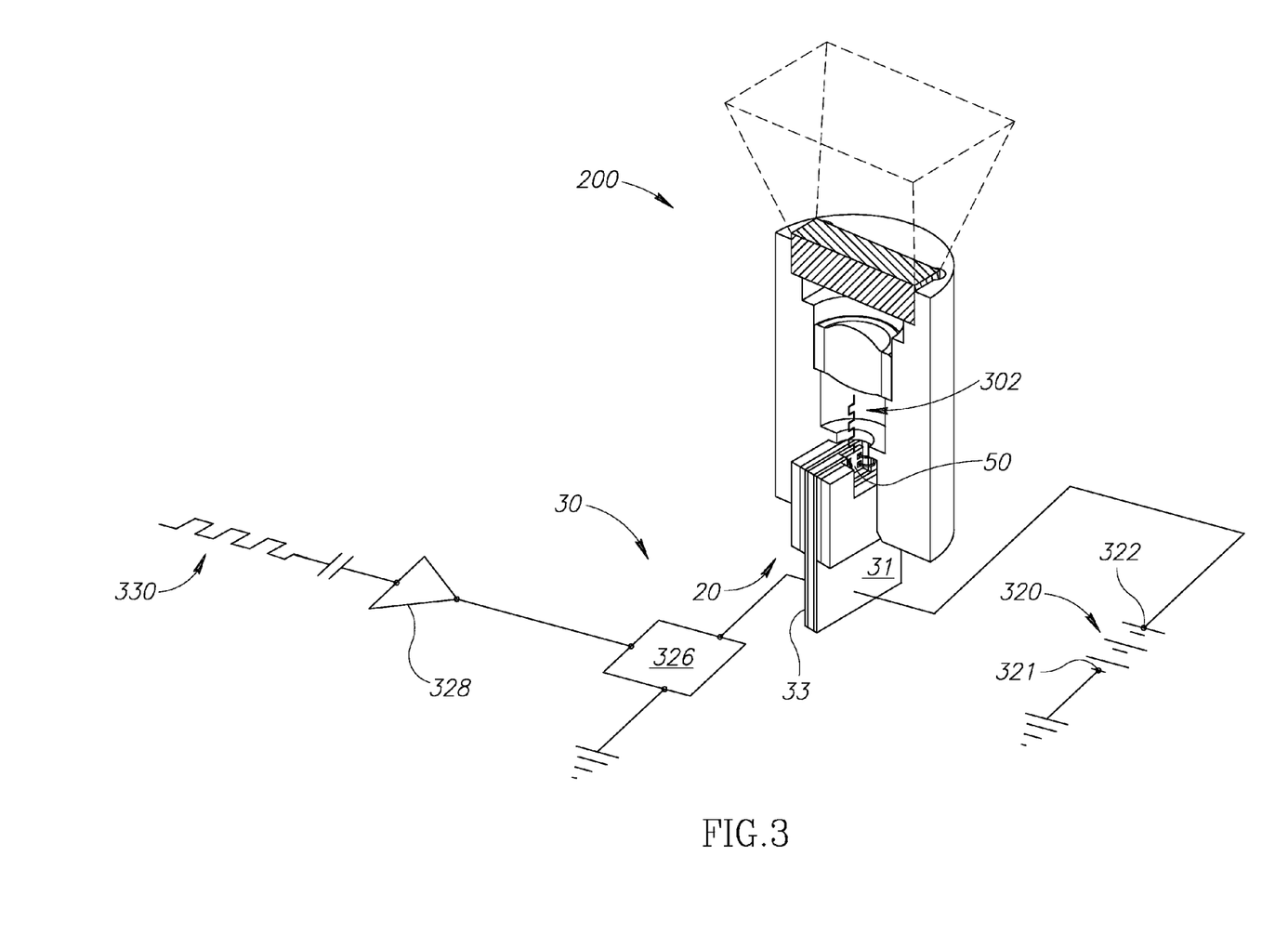
FIG. 3 shows a schematic of a circuit for driving a light source module similar to that shown in FIG. 2, in accordance with an embodiment of the invention.

In an embodiment of the invention, light source module 20 is coupled to optics that receives and shapes light from light source 50 to provide an illumination system configured to provide a desire illumination pattern. By way of example, FIG. 3 schematically shows a cutaway perspective view of an illumination system 200 comprising light source module 20 in accordance with an embodiment of the invention.

Illumination system 200 comprises a lens tube 202 optionally having a collimating lens 204 mounted to an annular lens frame 206 and a rectangular diffuser 208. Lens tube 202 may, by way of example, be fabricated from a metal, such as aluminum, or high impact plastic, such as a polystyrene or polystyrene copolymer, and is formed having a circular lumen 210 at one end of which is formed a ledge 211. Lens frame 206 seats on ledge 211 and may be maintained in place using any of various methods and devices known in the art. For example, the lens frame is optionally press fit into lumen 210 and/or is bonded by a suitable adhesive or epoxy to ledge 211. Diffuser 208 seats on a ledge 212 of an optionally rectangular recess 214 formed in lens tube 202 and is optionally press fit into the recess and/or is bonded to the ledge using a bonding material.

Light source module 20 seats in a recess 220 formed in lens tube 202 having a shape and depth that is matched to receive and have the light source module inserted so that the light source module is secured in the recess and substantially only male plug 44 protrudes from lens tube 202. Light source module may be secured in recess 220 using any of various methods and devices, and may for example be secured by a press fit into the recess and/or by bonding to a surface of the recess using an epoxy or adhesive. Illumination system 200 may be plugged into a suitable socket to receive power for powering light source 50 by inserting plug 44 of the light source module that extends below insulating shoulders 35 and 37 into the socket.

In an embodiment of the invention, collimating lens 204 receives light, schematically represented by wavy arrows 51, from light source 50, collimates the light and directs it to diffuser 208. Light 51 from the light source exits and propagates away from the light source in a cone of light (not shown) that usually does not have a circular cross section but typically exhibits an elongated, generally elliptical-like cross section. Diffuser 208 is optionally rectangular as shown in FIG. 3 to accommodate the elliptical-like cross section of light 51 from the light source. Diffuser 208 and light source module 20 are positioned and aligned in lens tube 202 by recesses 214 and 220 in which they are respectively held so that the long dimension of the diffuser is substantially parallel to the major axis of the elliptical-like cross section of light from light source 50. Diffuser 208 optionally configures the light it receives from light source 50 into a pyramid shaped cone beam of light whose outer envelope is schematically represented by dashed lines 220, which numeral is also used to refer to the cone beam, to illuminate a desired field of view (FOV) (not shown). Optionally, cone beam 220 is configured to illuminate a FOV of a 3D-TOF camera.

A relatively small footprint characterizes an illumination system, such as illumination system 200, in accordance with an embodiment of the invention. By way of a numerical example, in an embodiment of the invention, illumination system 200 has a height, $H_{200}$, less than or equal to about 9 mm. Optionally, $H_{200}$ is less than or equal to about 6 mm. A maximum width, $W_{200}$, of the illumination system is less than or equal to about 6 mm. In some embodiments of the invention, $W_{200}$ is equal to or less than 4 mm.

FIG. 3 schematically shows illumination system 200 coupled to a circuit 300 that powers the illumination system and controls it to transmit a train of light pulses 302 characterized by pulses having pulse widths "$P_W$" and a repetition frequency "v", in accordance with an embodiment of the invention. The pulses propagate away from the illumination systems in cone beam 220.

Circuit 300 comprises a power supply 320 having a first, negative terminal 321 connected to ground and a second, positive terminal 322 connected to conductor 31. Conductor 33 is connected to a switch 326. A driver 328 selectively controls the switch to connect the conductor 33 to ground or disconnect it from ground. When switch 326 connects conductor 33 to ground, current flows from power supply 320 through light source 50 and the light source emits light. Current ceases to flow through light source 50 and the light source stops emitting light when switch 326 disconnects conductor 33 from ground. Switch 326 is a switch characterized by rise and fall times that are short relative to pulse width $P_W$, and that has resistance and inductance that are relatively small in comparison to resistance and inductance contributed to circuit 300 by light source 50 and conductors 31 and 33.

Driver 328 optionally controls switch 326 responsive to an input signal schematically represented by a pulse train 330 repeatedly to turn on and turn off, and thereby to connect conductor 33 to ground for periods having duration $P_W$ at a repetition frequency v. As a result, illumination system 200 transmits light pulses 302 having pulse width substantially equal to $P_W$ at a repetition frequency v. In an embodiment of the invention, as by way of example given below, intensity I, light pulse width $P_W$, and transmission repetition frequency v are suitable to provide light pulses for acquiring a range image of the scene by a TOF 3D camera.

In an embodiment of the invention, $P_W$ is less than or equal to about 20 ns. Optionally, $P_W$ is less than or equal to about 15 ns. In some embodiments of the invention, $P_w$ is about equal to 5 ns. Optionally, repetition frequency v is equal to or greater than 250 kHz. In some embodiments of the invention v is greater than or equal to about 1 MHz. Optionally, the repetition frequency is greater than or equal to about 5 MHz.

By way of an example of an embodiment of the invention suitable for use in a TOF 3D camera, light source 50 is an edge emitting laser, optionally a laser marketed by OSRAM Opto Semiconductors Inc. having catalogue number SPL-PL85-3 that provides light pulses at an IR wavelength equal to about 850 nm (nanometers). Switch 326 may be a metal-oxide-semiconductor field-effect transistor (MOSFET) such as a MOSFET marketed by Fairchild Semiconductor Corporation under the catalogue number FDMS8692. Switch FDMS8692 has a resistance less than or equal to about 10 mΩ (milliohms), an inductance less than or equal to about 0.5 nH (nanohenry). The switch is characterized by a switching speed between on and off (conducting and non-conducting) states having rise and fall times respectively that are less than about 3 ns (nanoseconds). Optionally, switch 326 is turned on and turned off by pulse train 330 to control the SPL-PL85-3 laser to produce light pulses having pulse width $P_W$ equal to about 15 ns and repetition frequency v equal to about 0.5 MHZ.

For use in a TOF 3D camera, light pulses 302 may have a peak power of about 25 watts and for the 8 ns (FWHM) pulse width and 0.5 MHZ repetition frequency, provide optical power at about 90 mW (milliwatts). Assuming that illumination system 200 has an inductance equal to 2.3 nH referred to above, power supply 320 provides the illumination system with about 300 mW of electrical power. An efficiency with which the illumination system transduces electrical power into optical power is therefore about 30%. Further reduction in inductance resulting from configurations of connector 30 in accordance with an embodiment of the invention may improve efficiency substantially linearly with the magnitude of the reduction.

A conventional illumination system having inductance equal to about 4 nH and producing the same light pulses at the same repetition frequency generally exhibits an efficiency for converting electrical to optical energy less than about 27%. A configuration of conductors in accordance with an embodiment of the invention, such as that exhibited by conductors 30 and 40 therefore provides an improvement in energy conversion between about 26% to about 33%.

Because of their design, a plurality of light source modules, such as light source modules 20 and 120 shown in FIGS. 1A and 1B, in accordance with an embodiment of the invention, may be simultaneously produced relatively efficiently.

Figure 4A:
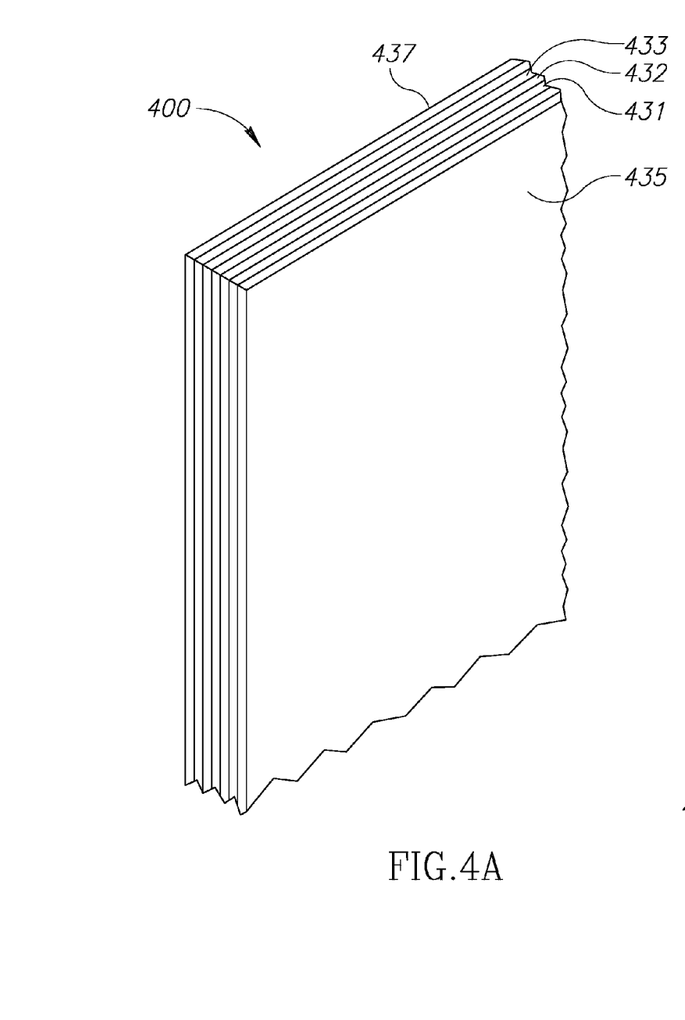
FIGS. 4A and 4B schematically show stages in a production process for simultaneously producing a plurality of light source modules similar to the light source modules shown in FIGS. 1A-1D, in accordance with an embodiment of the invention.
Figure 4B:
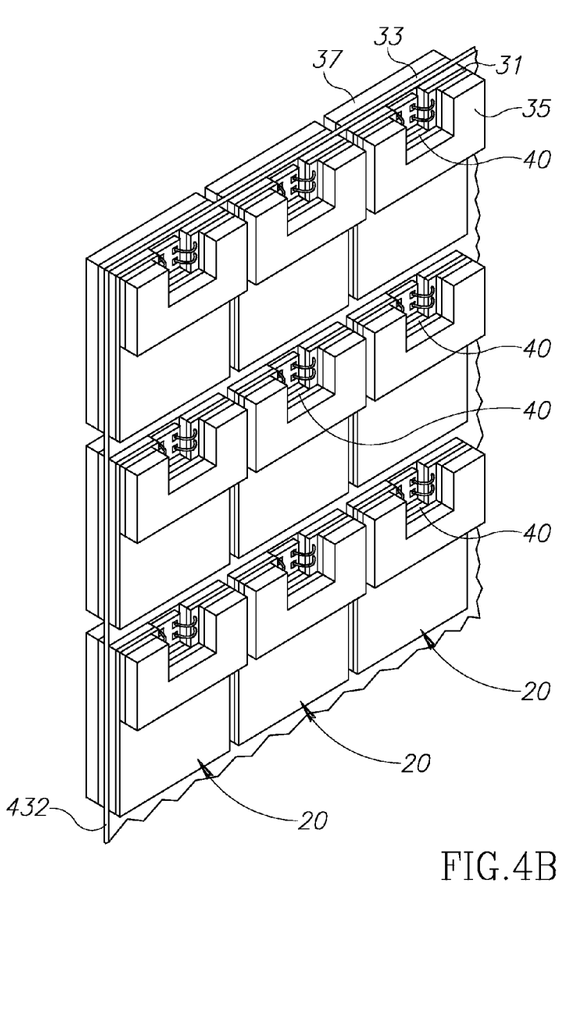

For example, conducting and insulating layers may be bonded together to form a stack 400 schematically shown in FIG. 4A comprising two outer insulating layers 435 and 437 that sandwich between them two conducting layers 431 and 433 separated by an insulating layer 432. Stack 400 may then be processed to form from a first side of the stack an ordered array of rows and columns of recesses 40, conductors 31 and insulating shoulders 35 (FIGS. 1A and 1B), and from a second side of the stack an array of rows and columns of insulating shoulders 37 (FIGS. 1A and 1B) and conductors 33 that is a minor image of the array of insulating shoulders 35 and conductors 31. The arrays may be formed using any of various methods and devices known in the art. For example, the arrays may be formed by lithographic processes, chemical etching, laser ablation, and/or micromachining. After formation of the arrays, light sources 50 may be connected to conductors 31 and 33 using pick and place and bondwire connection processes. A resulting array of light source modules 20, schematically shown in FIG. 4B, is formed on and connected by insulating layer 432 and may then be diced to separate the light source modules.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:
1. A light source module comprising:
   a connector comprising a layer of insulating material sandwiched between first and second conducting layers and having formed therein a recess that extends through the first conducting layer and the insulating layer to expose a region of the second conducting layer; and a semiconducting light source having first and second electrical contacts for receiving power that excites the light source to emit light;

wherein the light source seats in the recess and has the first electrical contact electrically connected to the first conducting layer and the second electrical contact electrically connected to the exposed region of the second conducting layer.

2. A light source module according to claim 1 wherein the second electrical contact is directly bonded to the exposed region of the second conducting layer by a conducting medium.

3. A light source module according to claim 1 wherein the first electrical contact is connected to a region of the first conducting layer along an edge of the recess.

4. A light source module according to claim 3 wherein the first electrical contact is electrically connected to the first conducting layer by at least one bondwire.

5. A light source module according to claim 4 wherein the bondwire has a length less than or equal to about 0.5 mm.

6. A light source module according to claim 1 and comprising first and second additional insulating layers that sandwich the conducting layers between them and are bonded respectively to the first and second conducting layers.

7. A light source module according to claim 6 wherein the first additional insulating layer is formed having a recess that exposes a region of the first conducting layer to which the first electrical contact is electrically connected.

8. A light source module according to claim 6 wherein the first and second additional insulating layers expose regions of the first and second conducting layers suitable for making contact with a power supply.

9. A light source module according to claim 8 wherein the exposed regions are mirror images of each other.

10. A light source module according to claim 1 wherein the layers have thickness less than or equal to about 0.5 mm.

11. A light source module according to claim 10 wherein the layers have thickness less than or equal to about 0.3 mm.

12. A light source module according to claim 10 wherein the first and second conducting layers have thickness between about 0.1 mm and about 0.2 mm.

13. A light source module according to claim 1 wherein the insulating layer between the conducting layers has thickness between about 0.2 mm and about 0.3 mm.

14. A light source module according to claim 1 wherein the connector has a height substantially in a direction along which the light source emits light less than or equal to about 5 mm.

15. A light source module according to claim 14 wherein the height is less than or equal to about 2.5 mm.

16. A light source module according to claim 1 wherein the connector has a width substantially perpendicular to a direction along which the light source emits light that is less than or equal to about 3 mm.

17. A light source module according to claim 1 wherein the connector has a height and width less than or equal to about 1.8 mm and 2 mm respectively.

18. A light source module according to claim 1 wherein the connector is characterized by an inductance that is less than or equal to about 3 nH (nanoHenrys).

19. A light source module according to claim 18 wherein the connector is characterized by an inductance that is less than or equal to about 2 nH.

20. An illumination system comprising:
a light source module according to claim 1;
a tube having a recess in which the light source module seats;
a lens seated in the tube to receive light from the light source module and to collimate the received light; and
a diffuser seated in the tube to receive collimated light from the lens and to diffuse the received light.

* * * * *